(12) United States Patent
Lee

(10) Patent No.: US 7,449,538 B2
(45) Date of Patent: Nov. 11, 2008

(54) HARD MASK COMPOSITION AND METHOD FOR MANUFACTURING SEMICONDUCTOR DEVICE

(75) Inventor: Geun Su Lee, Gyeonggi-do (KR)

(73) Assignee: Hynix Semiconductor Inc., Gyeonggi-Do (KR)

( * ) Notice: Subject to any disclaimer, the term of this patent is extended or adjusted under 35 U.S.C. 154(b) by 399 days.

(21) Appl. No.: 11/421,897

(22) Filed: Jun. 2, 2006

(65) Prior Publication Data

US 2007/0154838 A1 Jul. 5, 2007

(30) Foreign Application Priority Data

Dec. 30, 2005 (KR) .................... 10-2005-0135270

(51) Int. Cl.
*C08G 77/04* (2006.01)

(52) U.S. Cl. .................. 528/29; 524/588; 430/270.1

(58) Field of Classification Search .................. 528/29
See application file for complete search history.

(56) References Cited

U.S. PATENT DOCUMENTS

2005/0031964 A1* 2/2005 Babich et al. .................. 430/5
2005/0042538 A1* 2/2005 Babich et al. ............. 430/270.1

* cited by examiner

*Primary Examiner*—Randy Gulakowski
*Assistant Examiner*—Olatunde S Ojurongbe
(74) *Attorney, Agent, or Firm*—Marshall, Gerstein & Borun LLP

(57) ABSTRACT

Disclosed herein is a cross-linking polymer that includes a silicon compound and a hydroxyl compound. Also disclosed herein is a composition that includes the cross-linking polymer and an organic solvent. The composition can be used as a part of hard mask film applied over an underlying layer during the manufacture of a semiconductor device. The hard mask film is useful in the formation of a uniform pattern on the device.

21 Claims, 4 Drawing Sheets

HARD MASK COMPOSITION AND METHOD FOR MANUFACTURING SEMICONDUCTOR DEVICE

BACKGROUND OF THE INVENTION

1. Field of the Disclosure

The disclosure generally relates to a hard mask composition and a method for manufacturing a semiconductor device using the composition.

2. Brief Description of Related Technology

As the fields of application of semiconductor devices have expanded, there has been a need to manufacture a memory device of high capacity with improved integrity. Semiconductor manufacturing processes necessarily include a lithography process for forming a line pattern (such as a gate line and a bit line), or a contact hole pattern (such as a bit line contact).

In order to form a critical dimension (CD) below 0.07 μm, the lithography process has been developed with Deep Ultra Violet (DUV) light sources of short wavelength such as ArF (193 nm) or VUV (157 nm) instead of long wavelength light sources such as I-line or KrF (248 nm).

Generally, the lithography process includes a process for forming a bottom anti-reflection layer in the bottom of the photoresist film so as to prevent scattered reflection from a bottom layer of a photoresist film and remove standing waves resulting from thickness variation of a photoresist film.

On the other hand, the thickness of photoresist layers also becomes smaller to prevent photoresist patterns from collapsing during the lithography process. As a result, it is difficult to secure an etching selectivity of a photoresist pattern as an etching mask on an underlying layer during the etching process.

In order to secure the etching selectivity, a multi-layer hard mask film having the etching rate relatively higher than that of the photoresist pattern is formed between the underlying layer and the photoresist pattern in the conventional method for manufacturing a semiconductor device. For example, the above-described conventional method includes forming a multi-layer hard mask film including an amorphous carbon film 3 and insulating film 5 on an underlying layer 1 over a semiconductor substrate, and then sequentially forming an anti-reflection film 7 and a photoresist pattern 9 (see FIG. 1).

Consequently, films that serve as the organic anti-reflection layer and the hard mask film are required to simplify the process.

A conventional composition for the organic anti-reflection layer satisfies the following conditions.

First, while an anti-reflection layer is coated and then a photoresist layer is coated, the anti-reflection layer should not be dissolved by an organic solvent in a photoresist composition. Thus, the anti-reflection layer is designed to have a cross-linking structure in a process for coating an anti-reflection layer composition and baking the composition to deposit the anti-reflection layer. Here, other chemical materials should not be generated as by-products.

Second, the composition is required to contain a material having a high light absorbance to light sources to inhibit scattered reflection from a bottom layer.

Third, the composition is required to contain a catalyst for activating the cross-linking reaction in the process for depositing the anti-reflection composition.

Moreover, a film used as the hard mask film is required to have the excellent etching selectivity to the bottom-underlying layer.

SUMMARY OF THE INVENTION

Disclosed herein is a cross-linking polymer that includes a silicon compound and a hydroxyl compound. The silicon compound has a structure shown in Formula 1

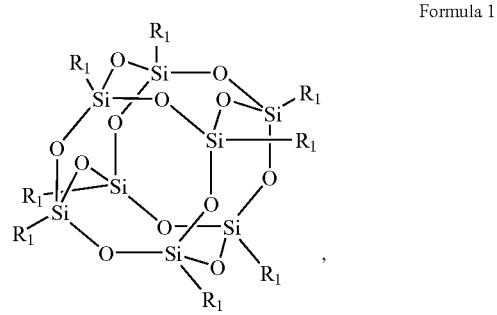

Formula 1

The hydroxyl compound has a structure shown in Formula 2

Formula 2

In the foregoing Formulas 1 and 2, $R_1$ is $(CH_2)_k Si(OR')_3$; R' is selected from the group consisting of H, linear $C_1$-$C_{10}$ alkyl, and branched $C_1$-$C_{10}$ alkyl; k is an integer ranging from 1 to 10; m is an integer ranging from 0 to 5; and, n is an integer ranging from 0 to 5.

Also disclosed herein is a hard mask composition that includes the cross-linking polymer and an organic solvent. The hard mask composition serves as an anti-reflection layer and has a relatively higher or similar etching selectivity to that of a photoresist material to secure the etching selectivity to a bottom underlying layer when an underlying layer pattern is formed.

Also, disclosed herein is a method for manufacturing a semiconductor device to form a uniform pattern using the hard mask composition. The method includes coating a hard mask film on an underlying layer, patterning the hard mask film to form a hard mask pattern, and patterning the underlying layer using the hard mask pattern as an etching mask to form an underlying pattern. The hard mask film is formed of the hard mask composition disclosed above.

Additional features of the invention may become apparent to those skilled in the art from a review of the following detailed description, taken in conjunction with the drawings, the examples, and the appended claims.

BRIEF DESCRIPTION OF THE DRAWING FIGURES

For a more complete understanding of the invention, reference should be made to the following detailed description and accompanying drawings, wherein.

Figure 1:
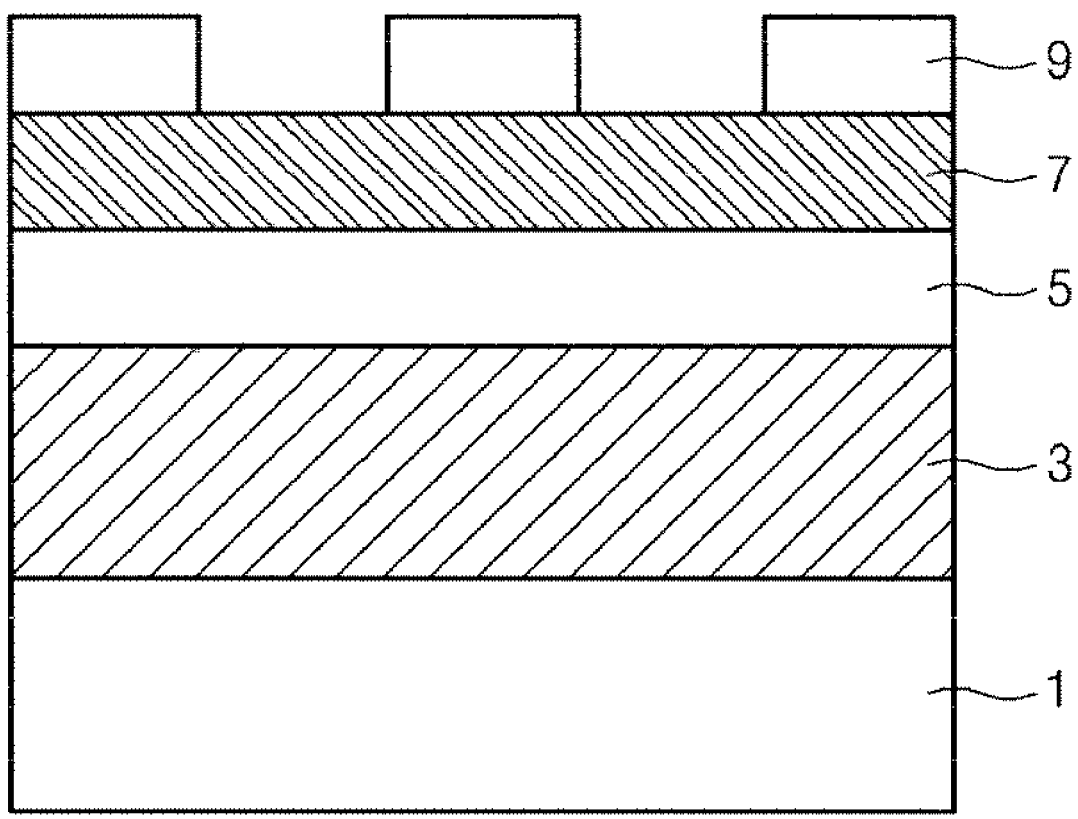
FIG. 1 is a cross-sectional diagram illustrating a multi-layer structure of a conventional process including a hard mask film.

While the disclosed polymer, composition, and method are susceptible of embodiments in various forms, there are illustrated in the drawing (and will hereafter be described) specific embodiments of the invention, with the understanding that the disclosure is intended to be illustrative, and is not intended to limit the invention to the specific embodiments described and illustrated herein.

DETAILED DESCRIPTION OF THE INVENTION

Disclosed herein is a cross-linking polymer that includes a silicon compound and a hydroxyl compound. The silicon compound has a structure shown in Formula 1

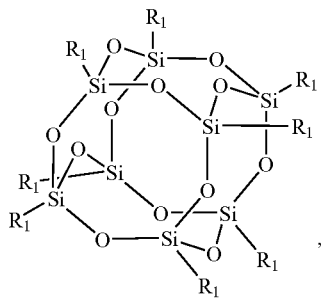

Formula 1

The hydroxyl compound has a structure shown in Formula 2

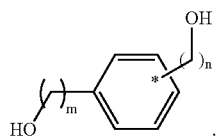

Formula 2

In the foregoing Formulas 1 and 2, $R_1$ is $(CH_2)_k Si(OR')_3$; $R'$ is selected from the group consisting of H, linear $C_1$-$C_{10}$ alkyl, and branched $C_1$-$C_{10}$ alkyl; k is an integer ranging from 1 to 10; m is an integer ranging from 0 to 5; and, n is an integer ranging from 0 to 5.

The silicon compound preferably has a molecular weight ranging from 300 to 30,000. Furthermore, the silicon compound is preferably polyhedral oligomeric silsesquioxane-octa(trimethoxysilylmethyl) substituted or polyhedral oligomeric silsesqujoxane-octa(trimethoxysilylethyl) substituted.

The silicon compound causes a cross-linking reaction between compounds to improve an etching selectivity of a hard mask film. Preferably, the silicon compound includes Si in an amount ranging from 15 wt % to 45 wt %, based on the total weight of the silicon compound, thereby forming a cross-linking reaction between an oxygen included in etching gas and a silicon element As a result, a hard mask film of the present invention secures an etching selectivity to an underlying layer.

The silicon compound of Formula 1 is obtained by reacting (a) a compound of Formula 3

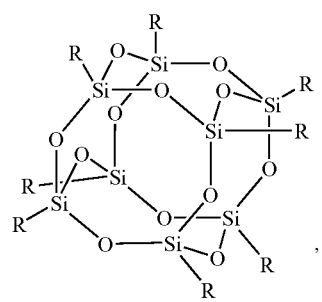

Formula 3 wherein R is $(CH_2)_k SiCl_3$, and k is an integer ranging from 1 to 10, and (b) a $C_1$-$C_{10}$ alkyl alcohol. The reaction is performed by combining the compound of Formula 3 and the alcohol in a weight ratio of 1:8 at room temperature.

The hydroxyl compound of Formula 2 preferably has a molecular weight ranging from 100 to 10,000. The hydroxyl compound is represented by a compound including a benzene ring and a diol structure. For example, the hydroxyl compound is represented by resorcinol or 1,4-benzenedimethanol. Preferably, the hydroxyl compound is present in an amount ranging from 10 parts by weight to 80 parts by weight, based on 100 parts by weight of the silicon compound of Formula 1.

Because the hydroxyl compound shows a high light absorbance to DUV, specifically ArF (193 nm), reflected lights and standing waves generated from the bottom layer are removed to increase the light absorbance of the wavelength region. Also, the hydroxyl compound reacts with the silicon compound of Formula 1 to form a cross-linking polymer.

The cross-linking polymer preferably has a molecular weight ranging from 500 to 50,000. If the molecular weight of the disclosed cross-linking polymer is less than 500, then the coating characteristic of the disclosed hard mask composition is degraded, and the hard mask film is dissolved in a photoresist solvent when a subsequent photoresist is formed. On the other hand, because a cross-linking density in the disclosed hard mask composition increases when the molecular weight of the disclosed cross-linking polymer exceeds 50,000, the etching selectivity of the disclosed hard mask film exceeds that of the photoresist film. As the result, the etching speed is decreased.

Although the disclosed cross-linking polymer forms a cross-linking even at room temperature, the cross-linking density increases in a subsequent baking process.

Also, disclosed herein is a hard mask composition that includes the disclosed cross-linking polymer and an organic solvent.

Any of the organic solvents useful as a conventional solvent for an anti-reflection layer composition can be used. Preferably, the organic solvent is selected from the group consisting of ethyl 3-ethoxypropionate, methyl 3-methoxypropionate, cyclohexanone, propylene glycol monomethyl ether acetate (PGMEA), 2-heptanone, ethyl lactate, and mixtures thereof. Preferably, the organic solvent is present in an amount ranging from 500 parts by weight to 10,000 parts by weight, based on 100 parts by weight of the cross-linking polymer. The hard mask film having a sufficient thickness cannot be obtained when the organic solvent is present in the amount of more than 10,000 parts by weight. When the organic solvent is present in the amount of less than 500 parts by weight, the hard mask film is thickly formed so that it is difficult to etch a pattern vertically.

The disclosed hard mask composition also can include a catalyst selected from the group consisting of a thermal acid generator, a photoacid generator and combinations thereof. The catalyst is useful to increase the cross-linking between the compounds during baking.

The addition amount of catalyst can be adjustably selected to serve as a catalyst. For example, the catalyst may be present in a range from 0.1 parts by weight to 10 parts by weight, based on 100 parts by weight of the disclosed cross-linking polymer.

Any of the conventional thermal acid generators can be used. Preferably, the thermal acid generator is selected from the group consisting of a compound of Formula 4a

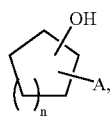

Formula 4a a compound of Formula 4b

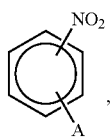

Formula 4b and mixtures thereof, wherein A is a functional group comprising a sulfonyl group, and n is 0 or 1.

Preferably, the sulfonyl group is

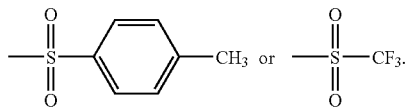

More preferably, the thermal acid generator is 2-hydroxy-lhexyl p-toluenylsulfonate.

The photoacid generator preferably is selected from the group consisting of phthalimidotrifluoromethane sulfonate, dinitrobenzyltosylate, n-decyldisulfone, naphtylimidotrifluoromethane sulfonate, diphenyl p-methoxyphenyl sulfonium triflate, diphenyl p-toluenyl sulfonium triflate, diphenyl p-isobutylphenyl sulfonium triflate, triphenylhexafluoro arsenate, triphenylhexafluoro antimonate, triphenylsulfonium triflate, dibutylnaphtyl sulfonium triflate, and mixtures thereof.

The catalyst serves as a catalyst for activating the cross-linking reaction between the silicon compound and an —OH group of the hydroxyl compound of Formula 2. For example, when a thermal process or baking process is performed after the hard mask composition (containing the catalyst, such the thermal acid generator or the photoacid generator) is coated on a wafer, acid is generated from the catalyst, and the above-described cross-linking reaction occurs by the generated acid. As a result, the hard mask film, which is not dissolved in the photoresist solvent, is formed.

Because the above-described hard mask composition contains a cross-linking structure including a benzene ring having a high light absorbance to short wavelength, the composition serves as an anti-reflection layer to remove scattered reflection lights and standing waves generated from the bottom layer in an exposure process and also secures an etching selectivity to an underlying layer by the cross-linking structure between the compounds.

Also, disclosed herein is a method for manufacturing a semiconductor device. The method includes coating a hard mask film on an underlying layer, patterning the hard mask film to form a hard mask pattern, and patterning the underlying layer using the hard mask pattern as an etching mask to form an underlying pattern. The hard mask film is formed of the hard mask composition disclosed above. The method also can include forming an amorphous carbon layer or a polymer layer having a high carbon content on the underlying layer before coating the disclosed composition for hard mask to secure the etching selectivity of the hard mask film. The disclosed hard mask film may be formed as a single layer to simplify the process step. The disclosed hard mask film is formed with equipment for forming a conventional photoresist film. It is easy to remove the hard mask film by a common removal process with a thinner, an alkali solvent or a fluorine gas.

Figure 2A:
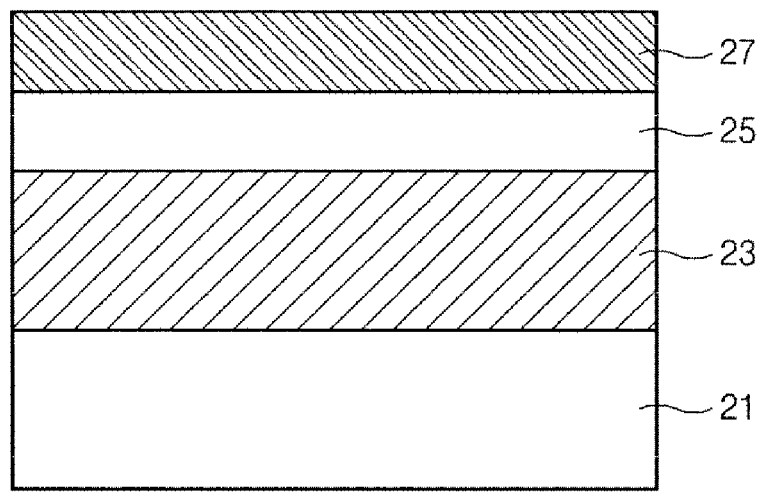
FIGS. 2a through 2d are cross-sectional diagrams illustrating a disclosed method for forming a pattern of a semiconductor device.

Hereinafter, the disclosed method for forming a pattern of a semiconductor device described in detail. Referring to FIG. 2a, an underlying layer 23 is formed over a substrate 21. The disclosed composition for hard mask is coated over the underlying layer 23, and then a baking process is performed to form a hard mask film 25. The underlying layer includes an oxide nitride film or an oxide film.

The baking process is performed at a temperature ranging from 100° C. to 300° C. for 1 minute to 5 minutes. Here, the cross-linking density in the hard mask film increases by acid generated from a thermal acid generator or a photoacid generator in baking process. The hard mask film has a thickness ranging from 500 Å to 2000 Å. Before the hard mask film is formed, an amorphous carbon layer or a polymer having high carbon content is further formed to be used as a double-layered hard mask film. A conventional chemical amplification-type photoresist composition is coated on the hard mask film 25, and then baked to form a photoresist film 27 (see FIG. 2a).

Figure 2B:
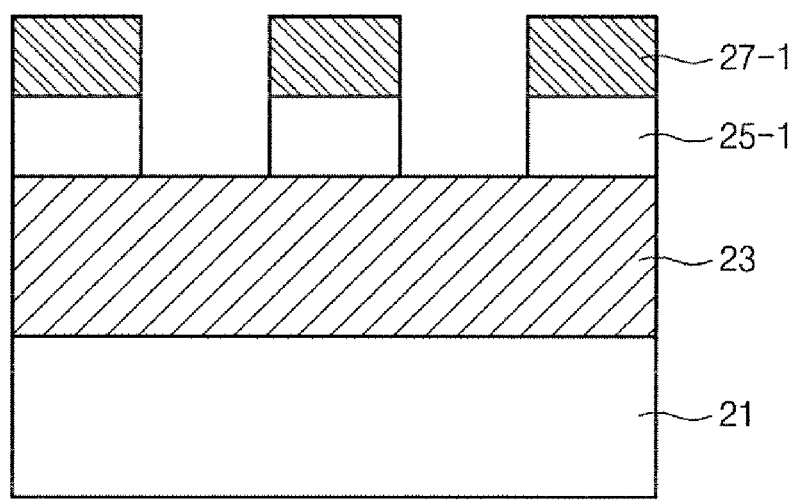
Figure 2C:
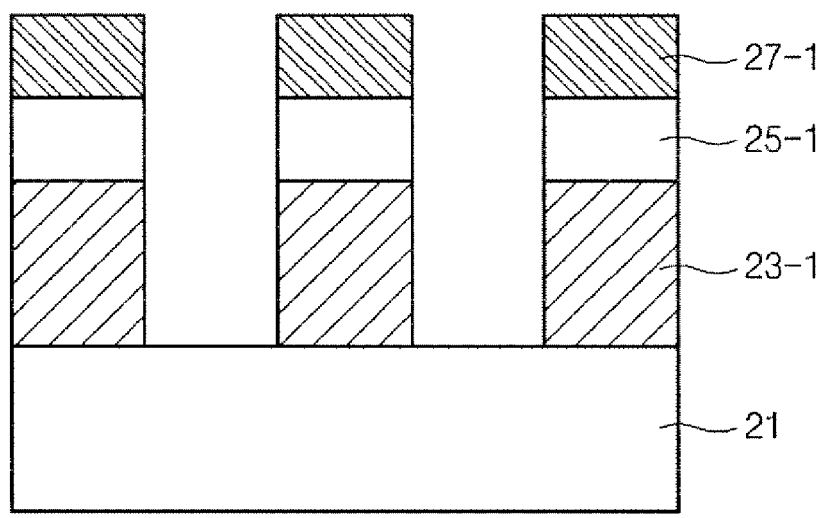

An exposure and developing process is performed on the photoresist film 27 of FIG. 2a to form a photoresist pattern 27-1. Then, an etching process is performed on the hard mask film 25 with the photoresist pattern 27-1 as an etching mask to form a hard mask film pattern 25-1 as shown in FIG. 2b. Thereafter, an etching process is performed on the underlying layer 23 with a deposition pattern including the photoresist pattern 27-1 and the hard mask pattern 25-1 of FIG. 2b as an etching mask to form an underlying layer pattern 23-1 as shown in FIG. 2c.

Preferably, the etching process is performed with an etching gas selected from the group consisting of $Cl_2$, Ar, $N_2O_2$, $CF_4$, $C_2F_6$, and mixtures thereof. The power can be variously applied depending on etching equipment, used gases and process kinds in the etching process. Preferably, the power is applied by a source RF power ranging from 300 W to 1000 W and the bias power ranging from 0 W to 300 W.

Figure 2D:
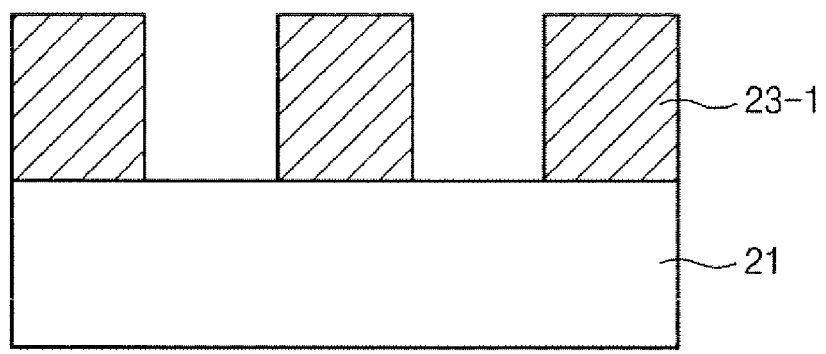

Thereafter, a removal process is performed with a conventional thinner composition, an alkali solvent, or a fluorine gas, to remove the photoresist pattern 27-1 and the hard mask pattern 25-1 remaining after the etching process so that the underlying layer pattern 23-1 is formed over the substrate 21 as shown in FIG. 2d. The disclosed hard mask composition and the disclosed method for manufacturing a semiconductor device are then applied to a process for forming an ultra fine pattern with DUV light sources of short wavelength such as KrF, VUV, EUV, E-beam, X-ray or ion-beam, preferably ArF (193 nm).

Additionally, there is provided herein a semiconductor device manufactured by the disclosed method including the pattern formation process.

The disclosed compositions will be described in detail by referring to examples below, which are not intended to limit the present invention.

I. Preparation of a Disclosed Hard Mask Composition

PREPARATION EXAMPLE 1

(1-1)polyhedral oligomeric silsesquioxane-octa(trimethoxysilylmethyl) substituted (30 g) was added in methanol (500 ml), and stirred at room temperature for 30 minutes. Then, resorcinol (3 g) was added in the resulting mixture, and stirred at room temperature for 1 hour. Thereafter, the resulting mixture was vacuum-distilled at below 40° C., and washed with methanol (200 ml×2). Next, the resulting mixture was filtered and dehydrated to obtain a cross-linking polymer (yield: 31 g, molecular weight: 3,400).

(1-2) The cross-linking polymer (5 g) obtained from Preparation Example 1-1 was dissolved in propylene glycol monomethyl ether acetate (PGMEA) (100 g). Then, the resulting mixture was filtered with a 0.2 μm filter to obtain a disclosed hard mask composition.

PREPARATION EXAMPLE 2

(2-1)polyhedral oligomeric silsesquioxane-octa(trimethoxysilylmethyl) substituted (30 g) was added in methanol (500 ml), and stirred at room temperature for 30 minutes. Then, resorcinol (3 g) was added in the resulting mixture, and stirred at room temperature for 1 hour. Thereafter, the resulting mixture was vacuum-distilled at below 40° C., and washed with methanol (200 ml×2). Next, the resulting mixture was filtered and dehydrated to obtain a cross-linking polymer (yield: 29.2 g, molecular weight: 3,620).

(2-2) In propylene glycol monomethyl ether acetate (PGMEA) (100 g) was dissolved the cross-linking polymer (5 g) obtained from Preparation Example 2-1, 2-hydroxyhexyl p-toluenylsulfonate (0.4 g) as a thermal acid generator and triphenylsufonium triflate (0.05 g) as a photoacid generator. Then, the resulting mixture was filtered with a 0.2 μm filter to obtain a disclosed hard mask composition.

II. Formation of a Disclosed Pattern

EXAMPLE 1

An oxide nitride film as an underlying layer was formed on a silicon wafer treated with hexamethyldisilazane (HMDS), and the hard mask composition (3 ml) of Preparation Example 1 was spin-coated thereon with 3000 rpm. Then, the resulting structure was baked at about 200° C. for about 90 seconds to form a hard mask film having a thickness of 920 Å.

Figure 3:
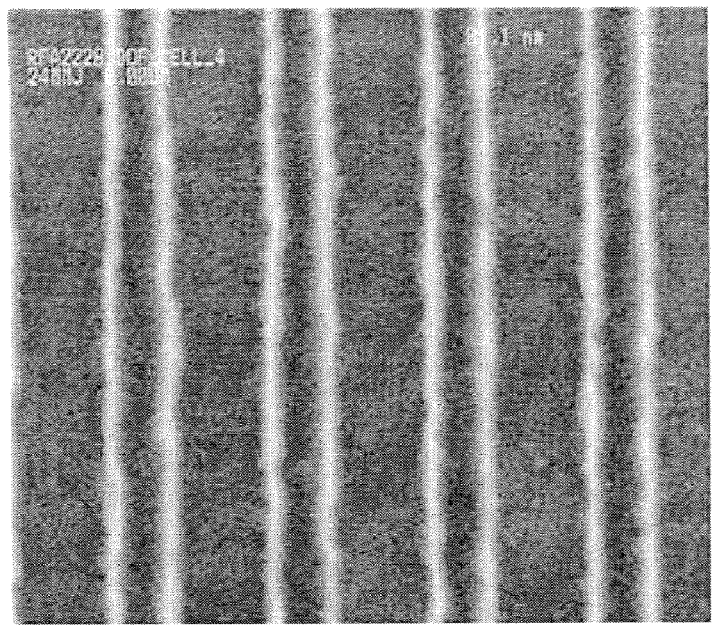
FIG. 3 is a SEM photograph illustrating a photoresist pattern obtained from Example 1; and, FIG. 4 is a SEM photograph illustrating an underlying layer pattern after an etching process of Example 1.

A photoresist film (Shin-Etsu Co., X-121) for ArF (193 nm) was coated at a thickness of 1700 Å on the hard mask film, soft-baked at about 120° C. for about 90 seconds, exposed with an ArF scanner (NA=0.85, ASML Co.), and then post-baked at about 120° C. for about 90 seconds. After post-baking, the film was developed in 2.38 wt % tetramethylammonium hydroxide (TMAH) aqueous solution to obtain 80 nm L/S photoresist pattern (see FIG. 3).

Figure 4:
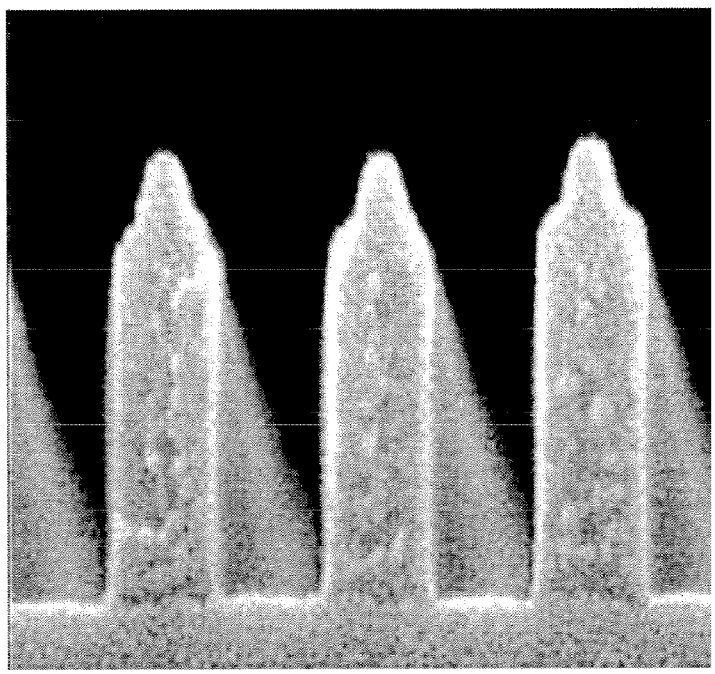

Thereafter, the hard mask pattern was etched with the photoresist pattern as an etching mask to form a hard mask pattern, and an etching process was performed on the underlying layer with the same etching process condition with the hard mask pattern as an etching mask to form a 80 nm L/S underlying layer pattern (see FIG. 4). Here, the etching process was performed with CF$_4$/Ar mixture etching gas (RF power: about 700 W, bias power: about 150 W).

EXAMPLE 2

The procedure of Example 1 was repeated using the composition for hard mask of Preparation Example 2 instead of the composition of Preparation Example 1 to obtain a 80 nm L/S underlying layer pattern.

EXAMPLE 3

A silicon oxide nitride film as an underlying layer was formed on a silicon wafer treated with HMDS, and an amorphous carbon layer having a thickness of 200 nm was formed thereon by a Chemical Vapor Deposition (CVD) method. Then, the composition (3 ml) for hard mask of Preparation Example 1 was spin-coated thereon with 3000 rpm, and baked at about 200° C. for about 90 seconds to form a hard mask film having a thickness of 920 Å.

A photoresist film (Shin-Etsu Co., X-121) for ArF (193 nm) was coated at a thickness of 1700 Å on the hard mask film, soft-baked at about 120° C. for about 90 seconds, exposed with an ArF scanner (NA=0.85, ASML Co.), and then post-baked at about 120° C. for about 90 seconds. After post-baking, the film was developed in 2.38 wt % tetramethylammonium hydroxide (TMAH) aqueous solution to obtain 80 nm L/S photoresist pattern.

Thereafter, the hard mask pattern was etched with the photoresist pattern as an etching mask to form a hard mask pattern, and an etching process was performed on the underlying layer with the same etching process condition with the hard mask pattern as an etching mask to form a 80 nm L/S underlying layer pattern. Here, the etching process was performed with CF$_4$/Ar mixture etching gas (RF power: about 700 W, bias power: about 150 W).

EXAMPLE 4

The procedure of Example 3 was repeated using the composition for hard mask of Preparation Example 2 instead of the composition of Preparation Example 1 to obtain a 80 nm L/S underlying layer pattern.

As described above, there is provided a disclosed composition for hard mask including a cross-linking polymer (consisting of a silicon compound and a hydroxyl compound) and an organic solvent. The disclosed composition is used as a hard mask film that has an anti-reflection layer and an excellent etching selectivity in a subsequent etching process so that a uniform underlying layer pattern is obtained. Also, a pattern formation process is simplified to reduce process cost.

The foregoing description is given for clearness of understanding only, and no unnecessary limitations should be understood therefrom, as modifications within the scope of the invention may be apparent to those having ordinary skill in the art.

What is claimed is:

1. A cross-linking polymer comprising:

(a) a silicon compound of Formula 1

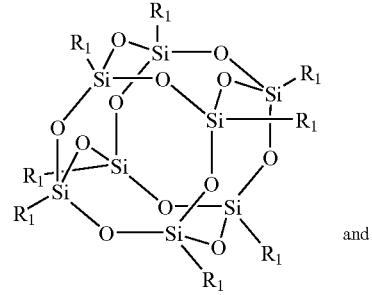

Formula 1 and (b) a hydroxyl compound of Formula 2

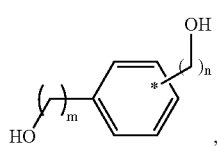

Formula 2 wherein $R_1$ is $(CH_2)_k Si(OR')_3$; R' is selected from the group consisting of H, linear $C_1$-$C_{10}$ alkyl, and branched $C_1$-$C_{10}$ alkyl; k is an integer ranging from 1 to 10; m is an integer ranging from 0 to 5; and, n is an integer ranging from 0 to 5.

2. The cross-linking polymer of claim 1, wherein the silicon compound has a molecular weight ranging from 300 to 30,000.

3. The cross-linking polymer of claim 1, wherein the silicon compound is polyhedral oligomeric silsesquioxane-octa (trimethoxysilylmethyl) substituted or polyhedral oligomeric silsesquioxane-octa(trimethoxysilylethyl) substituted.

4. The cross-linking polymer of claim 1, wherein the silicon compound comprises Si in an amount ranging from 15 wt % to 45 wt %, based on the total weight of the silicon compound.

5. The cross-linking polymer of claim 1, wherein the hydroxyl compound has a molecular weight ranging from 100 to 10,000.

6. The cross-linking polymer of claim 1, wherein the hydroxyl compound is resorcinol or 1,4-benzenedimethanol.

7. The cross-linking polymer of claim 1, wherein the hydroxyl compound is present in an amount ranging from 10 parts by weight to 80 parts by weight, based on 100 parts by weight of the silicon compound.

8. The cross-linking polymer of claim 1, wherein the cross-linking polymer has a molecular weight ranging from 500 to 50,000.

9. A hard mask composition comprising an organic solvent, and a cross-linking polymer, the cross-linking polymer comprising:

(a) a silicon compound of Formula 1

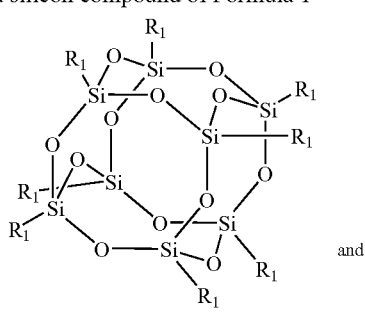

Formula 1 and (b) a hydroxyl compound of Formula 2

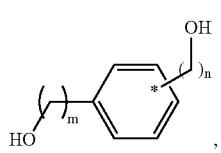

Formula 2 wherein $R_1$ is $(CH_2)_k Si(OR')_3$; R' is selected from the group consisting of H, linear $C_1$-$C_{10}$ alkyl, and branched $C_1$-$C_{10}$ alkyl; k is an integer ranging from 1 to 10; m is an integer ranging from 0 to 5; and, n is an integer ranging from 0 to 5.

10. The hard mask composition of claim 9, wherein the organic solvent is selected from the group consisting of ethyl 3-ethoxypropionate, methyl 3-methoxypropionate, cyclohexanone, propylene glycol monomethyl ether acetate (PGMEA), 2-heptanone, ethyl lactate, and mixtures thereof.

11. The hard mask composition of claim 9, wherein the organic solvent is present in an amount ranging from 500 parts by weight to 10,000 parts by weight, based on 100 parts by weight of the cross-linking polymer.

12. The hard mask composition of claim 9, further comprising a catalyst selected from the group consisting of a thermal acid generator, a photoacid generator, and mixtures thereof.

13. The hard mask composition of claim 12, wherein the catalyst is present in an amount ranging from 0.1 parts by weight to 10 parts by weight, based on 100 parts by weight of the cross-linking polymer.

14. The hard mask composition of claim 12, wherein the thermal acid generator is selected from the group consisting of (a) a compound of Formula 4a

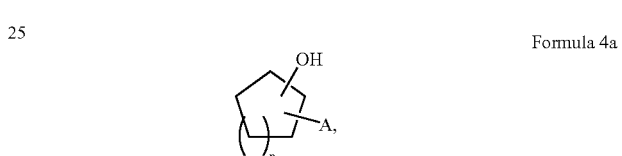

Formula 4a (b) a compound of Formula 4b

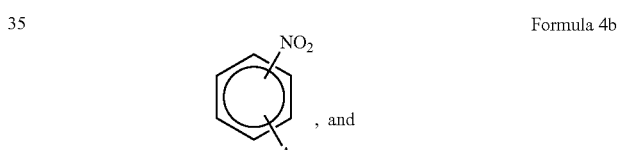

Formula 4b

, and mixtures thereof, wherein A is a functional group comprising a sulfonyl group, and n is 0 or 1.

15. The hard mask composition of claim 12, wherein the photoacid generator is selected from the group consisting of phthalimidotrifluoromethane sulfonate, dinitrobenzyltosylate, n-decyldisulfone, naphtylimidotrifluoromethane sulfonate, diphenyl p-methoxyphenyl sulfonium triflate, diphenyl p-toluenyl sulfonium triflate, diphenyl p-isobutylphenyl sulfonium triflate, triphenylhexafluoro arsenate, triphenylhexafluoro antimonate, triphenyl sulfonium triflate, dibutylnaphtyl sulfonium triflate, and mixtures thereof.

16. A method for manufacturing a semiconductor device comprising:

(a) coating a hard mask film on an underlying layer;

(b) patterning the hard mask film to form a hard mask pattern; and, (c) patterning the underlying layer using the hard mask pattern as an etching mask to form an underlying pattern, wherein said hard mask film comprises the hard mask composition of claim 9.

17. The method of claim 16, wherein the underlying layer is an oxide film or an oxide nitride film.

18. The method of claim 16, wherein the hard mask film has a thickness ranging from 500 Å to 2000 Å.

19. The method of claim 16, wherein the patterning process of steps (b) and (c) is performed using an etching gas selected from the group consisting of $Cl_2$, Ar, $N_2O_2$, $CF_4$, $C_2F_6$, and mixtures thereof.

20. The method of claim 16, wherein the coating step (a) further comprises forming an amorphous carbon layer or a polymer layer having a high carbon content on the underlying layer before forming the hard mask layer.

21. A semiconductor device manufactured by the method of claim 16.